United States Patent
Ochi

[11] 4,095,252
[45] June 13, 1978

[54] COMPOSITE JFET-BIPOLAR TRANSISTOR STRUCTURE

[75] Inventor: Sam S. Ochi, San Jose, Calif.

[73] Assignee: National Semiconductor Corporation, Santa Clara, Calif.

[21] Appl. No.: 754,290

[22] Filed: Dec. 27, 1976

[51] Int. Cl.$^2$ .............. H01L 27/02; H01L 29/80; H01L 29/72; H01L 29/06
[52] U.S. Cl. .............. 357/43; 357/20; 357/22; 357/34; 357/46; 357/48
[58] Field of Search .............. 357/20, 22, 34, 43, 357/46, 48

[56] References Cited
U.S. PATENT DOCUMENTS
3,408,544   10/1968   Teszner .............. 357/43

OTHER PUBLICATIONS
Lewis et al. "Single Device Cell Using Vertical Junction FET" IBM Technical Disclosure Bulletin vol. 15, (2/73), p. 28.

*Primary Examiner*—William D. Larkins
*Assistant Examiner*—Gene M. Munson
*Attorney, Agent, or Firm*—Gail W. Woodward

[57] ABSTRACT

A JFET is coupled in parallel with a bipolar transistor to produce a composite structure that has improved signal transfer characteristics in certain circuit applications. While useful with discrete devices, the combination is readily achieved in integrated circuit form.

6 Claims, 3 Drawing Figures

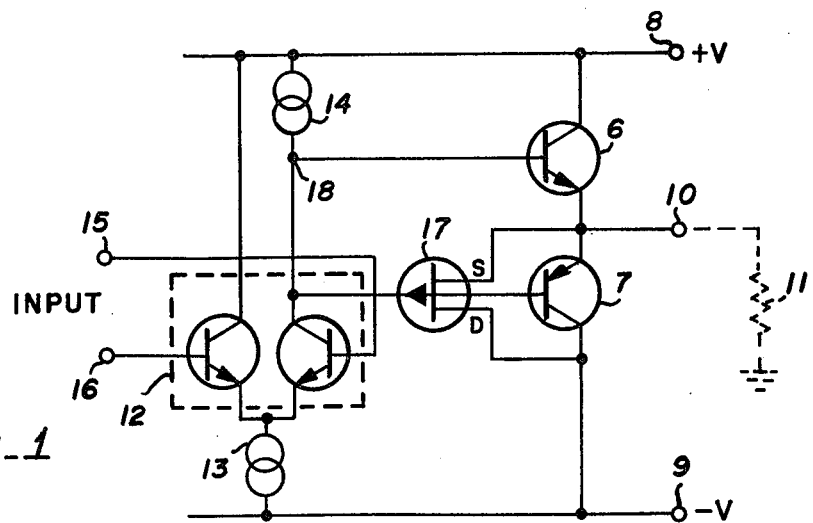
Fig_1
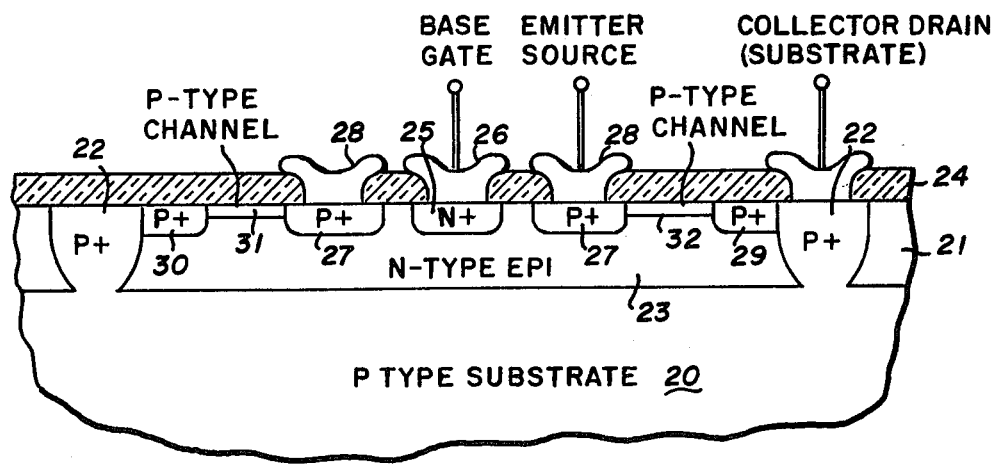
Fig_2
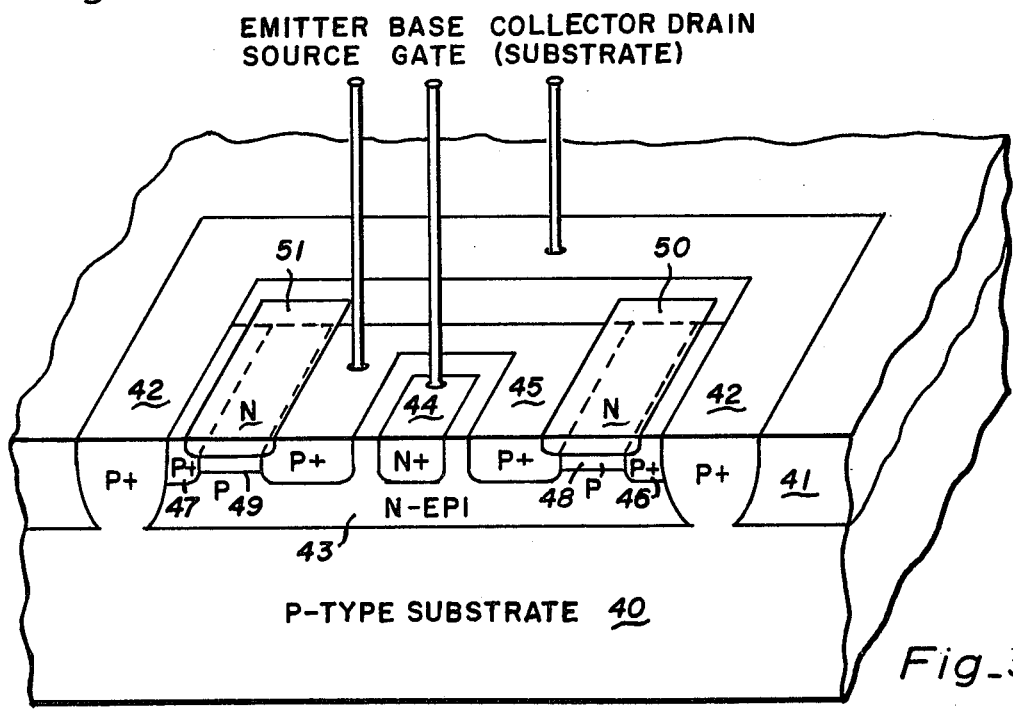
Fig_3

COMPOSITE JFET-BIPOLAR TRANSISTOR STRUCTURE

BACKGROUND OF THE INVENTION

The invention relates to transistor amplifiers and has particular application to complementary symmetry amplifiers. In a typical complementary symmetry amplifier, complementary transistors have their emitters coupled together and their collectors coupled to the two terminals of a power supply. The PNP transistor collector is coupled to the negative supply terminal and the collector of the NPN transistor is coupled to the positive power supply terminal. Desirably the load device which couples to the emitters is returned to a potential midway between the positive and negative terminals and typically this is referenced as ground potential. This configuration avoids the large coupling capacitor that must be used if the load is returned to any other potential. If the transistor base terminals are coupled together and driven from a common driver amplifier, the output will develop through emitter follower action to the load device. Thus the circuit is a voltage follower with the NPN transistor responding to the positive voltage excursions and the PNP responding to the negative excursions.

If only switching is desired this simple basic circuit works very well. However, if it is to be used as a linear amplifier it suffers from what is called crossover distortion. It can be seen that with no input signal neither transistor will conduct because the bases are at emitter potential. No conduction will occur until the transistor threshold is exceeded (about 0.6 volt in silicon devices operating at room temperature). Thus signals smaller than about 1.2 volts peak-to-peak will not be amplified appreciably. For an audio signal, this characteristic results in severe distortion that increases with smaller signals.

To avoid crossover distortion is common to provide a small bias selected to just barely turn the two transistors on with no applied signal. As a practical matter, the greater the zero signal current, the lower the crossover distortion. Therefore, ideally, the transistors are fully biased into class A operation for lowest distortion. However, this results in constant power supply drain which means that it is just as economical to use a single class A biased transistor. It is conventional to employ sufficient bias on the transistors so that they operate class A for very small signals and class B for large signals so that low quiescent current drain is combined with high power capability with tolerable distortion at all levels.

Unfortunately the actual bias selected will be a matter of judgement when weighing distortion against quiescent power economy. In any event some means of developing a quiescent bias is required and this has been the subject of much circuit development work. Since the bias voltage must ordinarily be varied as a function of transistor junction temperature, many rather complicated circuits have evolved.

SUMMARY OF THE INVENTION

It is an object of the invention to provide a composite bipolar transistor junction field effect transistor (JFET) combination that does not have a turn on threshold characteristic.

It is a further object of the invention to combine a JFET with a bipolar transistor in a simple composite structure amenable to integrated circuit fabrication.

These and other objects are obtained as will be explained below. A p-channel JFET is connected in parallel with a PNP transistor, source to emitter, drain to collector, and gate to base. This composite operates as a three-terminal element. At zero bias the JFET gate is at source potential and the saturation current $I_{DSS}$ will flow. This parameter can be selected by controlling the size of the JFET. To reduce the composite conduction to zero, the JFET gate must be driven positive with respect to its source. As the gate terminal is driven in a negative direction (toward the drain potential) conduction will be enhanced until the source drain diode becomes forward conductive. However, at this point the transistor has begun to conduct and it then dominates the composite conduction. Thus the composite structure has a high current capability along with the elimination of the threshold effect. While the structure has use in complementary symmetry amplifiers which have no crossover bias requirement, it is also useful in any application where the transistor turn on bias threshold is to be avoided.

The proposed composite can be fabricated in simplified form suitable for integrated circuit use. The JFET is fabricated into the base region of a bipolar transistor. The fabrication process automatically provides the required interconnections.

BRIEF DESCRIPTION OF THE DRAWING

FIG. 1 is a schematic diagram of a complementary symmetry amplifier using the composite structure of the invention;

FIG. 2 is a cross section of a semiconductor wafer into which the composite structure has been diffused; and FIG. 3 is an angle view of a cutaway section of a semiconductor wafer into which a preferred form of composite structure has been fabricated.

DESCRIPTION OF THE INVENTION

FIG. 1 is a schematic diagram of an amplifier using the invention. Complementary transistors 6 and 7 are series coupled across power supply terminals 8 and 9. The emitters are coupled together and to the output terminal 10. The output load 11 is taken between terminal 10 and ground which is specified as midway between +V and −V. Thus a split power supply is used with equal positive and negative voltages referenced to the load return terminal illustrated as ground. The collector of the NPN transistor 6 is coupled to the +V terminal while the PNP collector is coupled to the −V terminal. The transistor bases are coupled together to a driver amplifier comprising differential amplifier 12. A current source 13 couples to the emitters of differential amplifier 12 and load current source 14 is designed to supply half of the current flowing in source 13. Thus the differential amplifier is current balanced thereby making the circuit a differential input voltage follower.

JFET 17 is coupled in parallel with transistor 7. The composite P-channel JFET 17 is parallel connected with the PNP bipolar transistor 7 and operates as follows. With the potential at node 18 equal to the potential at terminal 10, transistor 7 would be at zero bias voltage and therefore non-conductive. For this potential condition JFET 17 will have its gate operating at its source potential and it will conduct a current equal to $I_{DSS}$. As node 18 is driven in a negative direction, JFET 17 will turn on more and drive terminal 10 as a source follower. As this negative going drive is increased, transistor 7 will turn on and drive terminal 10 as an emitter follower. Since the transistor takes over at high drive, the JFET does not need to be of the large area variety. Thus the best features of the JFET and transistor are utilized.

As the input voltage is driven in the positive direction the conduction through JFET 17 is reduced. A correctly selected JFET will completely pinch off at that voltage where transistor 6 turns on. At still higher positive drive levels transistor 6 acts as an emitter follower to drive output terminal 10. Thus JFET 17 acts as a source follower to drive the output in the input voltage range where the transistors 6 and 7 are non conductive and a very simple circuit is available to avoid crossover distortion.

If desired a second JFET not shown could be parallel coupled across transistor 6. In this case an N-channel device would be used. This configuration would have the advantage that for the condition where node 18 is at ground potential zero current would flow in load 11. In effect the two JFETS would be at $I_{DSS}$ and the saturation current would be equal to the quiescent or idling power supply current drain.

FIG. 2 is a cross section view of a semiconductor substrate showing a monolithic microcircuit form of the invention. The starting material is a P-type substrate 20 having an N-type epitaxial layer 21 deposited thereon as is conventional. A P-type isolation diffusion in the form of a ring is shown at 22. This isolates a tub 23 of epitaxial material that will contain the bipolar transistor JFET combination. It is to be noted that tub 23 might ordinarily contain a single PNP substrate collector transistor. An oxide layer 24 is grown over the epitaxial layer 21 to provide surface passivation.

Using conventional photolithographic planar processing, the remaining electrodes are diffused into the epitaxial surface. A heavily doped n-type region 25 is created to make ohmic contact to epitaxial tub 23. This region comprises the base of the bipolar transistor and the gate of the JFET. Metal contact 26 then provides the base gate connection. Heavily doped region 27 preferably a ring structure surrounding base electrode 25 provides the transistor emitter and metal contact 28 the external connection thereto. This contact will also become the JFET source electrode. Simultaneously with the diffusion of emitter 27 caps, 29 and 30 are diffused so as to overlap the isolation ring 22, thereby making contact thereto. Caps 29 and 30 are spaced from the edges of emitter 27 by an amount that establishes the desired JFET channel length. Then p-type channels 30 and 32 are diffused to a depth and concentration suitable for the JFET characteristics as is well known in the art. Since region 22 is ring shaped, caps 29 and 30 are connected in parallel and since region 27 is also a ring, the channels 31 and 32 comprise two JFETS connected in parallel. If desired, caps 29 and 30 can comprise a ring that completely surrounds emitter 27 so that the JFET becomes a ring structure also. Alternatively any portion of the ring may be employed to produce a JFET having a lesser channel width. The pair of caps shown in FIG. 2 is, by virtue of the construction, connected in parallel with the vertical PNP bipolar transistor and no external connections are needed to complete the composite circuit.

FIG. 3 shows an improved version of the invention in which the JFET device employs the buried channel construction. The drawing shows a cut away section and an angle view of the surface of the semiconductor. The usual oxide and metalization is omited for clarity of detail. It is to be understood that the section taken through the device is at the center of the transistors and the upper surface contours represent a mirror image of what is cut away. Thus, the C-shaped isolation region 42 is actually a ring formation.

The usual p-type substrate 40 is overlaid with epitaxial n-type layer 41. The p-type isolation diffusion region 42 isolates the n-type tub 43 which contains the transistor. N-type contact region 44 makes ohmic contact to tub 43. P-type diffused region 45, in the form of a ring, forms the bipolar transistor emitter and the JFET source. Simultaneously formed caps 46 and 47 form the JFET drain contacts which overlap and therefore connect to isolation region 42 and hence the transistor collector.

In the device shown, p-channel regions 48 and 49 are desirably formed by ion implantation, as is well known, to create a subsurface channel. The channels are then overlaid with thin n-type caps 50 and 51, also formed by ion implantation. N-type caps 50 and 51 overlap the channels so that the channels have upper gate contacts that, by virtue of the overlap, are ohmically connected to epitaxial tub 43. The JFET structure thus created has well controlled pinch off and very low surface-related noise generation.

By way of example, using the structure of FIG. 3, the substrate 40 could be a p-type wafer 15 mils thick and having about 6 ohm centimeters p-type conductivity. Epitaxial layer 41 would be about 12 microns thick and have n-type conductivity of about 5 ohm centimeters. The n+ type ohmic contact 44 would be about 3 microns deep with a sheet resistance of about 2.7 ohms per square. Emitter 45 would be p-type with a junction depth of about 3.5 microns and a sheet resistance of about 115 ohms per square. Thus, the transistor has an epitaxial base about 8.5 microns thick. Caps 50 and 51 could be ion implanted to an n-type level of about $2 \times 10^{12}$ carriers per cc to a depth of about 200 angstroms. Channels 48 and 49 are doped p-type to about $10^{12}$ carriers per cc to a depth of about 1000 angstroms under Caps 50 and 51.

The invention has been shown and described with a PNP bipolar transistor combined wth a p-channel JFET. Clearly the bipolar transistor could be an NPN device with an associated n-channel JFET, manufactured using well known integrated circuit techniques.

There are still other alternatives and equivalents within the spirit and intent of the invention that will occur to a person skilled in the art. Accordingly, it is intended that the invention be limited only by the following claims.

I claim:
1. A monolithic integrated circuit comprising:
a semiconductor substrate of a first conductivity type;
an epitaxial layer deposited on said substrate and having a second conductivity type;
a ring of diffused semiconductor material passing through said epitaxial layer and having said first conductivity type, said ring isolating a section of said epitaxial layer;
an emitter region of said first conductivity type contained within and extending from the surface thereof and part way through said isolated section of said epitaxial layer;

a contact region of said second conductivity type making ohmic contact with said isolated portion of said epitaxial layer; and a channel region of said first conductivity type extending between said emitter region and said isolation region over a portion of said epitaxial layer and extending into said epitaxial layer a distance that is small compared to the distance said emitter region extends into said epitaxial layer.

2. The monolithic integrated circuit of claim 1 further including a cap region of said first conductivity in contact with said isolation region and extending part way toward said emitter region whereby said channel region extends between said emitter region and said cap region.

3. The monolithic integrated circuit of claim 2 wherein said first conductivity is p-type and said second conductivity type is n-type.

4. The monolithic integrated circuit of claim 2 wherein said first conductivity type is n-type and said second conductivity type is p-type.

5. The monolithic integrated circuit of claim 2 wherein said channel region comprises a plurality of spaced regions extending between said emitter region and said cap region.

6. The monolithic integrated circuit of claim 2 wherein said channel region is covered with a layer of semiconductor having said second conductivity type, with said layer extending beyond the limits of said channel region thereby to be in ohmic contact with said epitaxial material.

* * * * *